United States Patent [19]

Dutta et al.

[11] Patent Number: 4,990,371
[45] Date of Patent: Feb. 5, 1991

[54] PROCESS FOR COATING SMALL SOLIDS

[75] Inventors: Arunava Dutta, Danvers; Leonard V. Dullea, Peabody; Ernest A. Dale, Hamilton, all of Mass.

[73] Assignee: GTE Products Corporation, Danvers, Mass.

[21] Appl. No.: 388,187

[22] Filed: Aug. 1, 1989

[51] Int. Cl.$^5$ .............................................. B05D 7/00
[52] U.S. Cl. ............................... 427/213; 427/213.31; 427/214; 427/215; 427/250; 427/255.3; 427/255.7; 427/398.1; 427/419.2
[58] Field of Search ................... 427/213, 213.31, 214, 427/215, 250, 255.3, 255.7, 398.1, 419.2

*Primary Examiner*—Bernard Pianalto
*Attorney, Agent, or Firm*—Ernest V. Linek

[57] ABSTRACT

The present invention is directed to processes and apparatus useful for fluidizing small particulate solids having a diameter of less than about 50 microns in average particle size, and at least partially enveloping these small solids with a coating material or a precursor thereto. The basic apparatus of this invention comprises:

a cross-current multi-stage fluid bed reactor having N fluid beds in flow communication with one another, wherein $N > 2$;

means for introducing small solid particles to a bed selected from the N beds of the reactor;

means for introducing a fluidizing gas to the N beds of the reactor, thereby promoting a flow of the small solid particles from the first bed through bed #N of the multi-stage fluid bed reactor;

means for introducing a coating material or a precursor thereto, to one or more of the N beds of the reactor;

means for distributing the coating material or precursor thereto throughout the cross-section of the reactor beds containing the same;

means for controlling the residence or contact time of the small articulate solids in the beds containing the coating material or the precursor thereto, such that the small particulate solids therein are at least partially enveloped by the coating material or precursor thereto; and one or more exit means for removal of the fluidizing gas and the small solid particles at least partially enveloped by coating material or precursor thereto.

31 Claims, 4 Drawing Sheets

PROCESS FOR COATING SMALL SOLIDS

BACKGROUND OF THE INVENTION

The present invention is directed to fluidized bed reactors, particularly multi-stage or multi-bed fluidized bed reactors and processes utilizing such reactors for coating particulate materials.

Single stage (or bed) fluidized reactors are well known and have been extensively developed. See for example, Sigai, U.S. Pat. No. 4,585,673, the disclosure of which is hereby incorporated herein by reference. See also, Kunii et al., "Fluidization Engineering" R. E. Krieger Publishing Co., Huntington, N.Y. (1977), particularly pp. 489–493. Multi-stage fluidized bed reactors are also known, but not as extensively developed as the single stage variety.

In Hemminger, U.S. Pat. No. 2,494,337 there is described an apparatus for contacting finely divided solid particles with gaseous material which comprises vertically positioned fluid beds with downcomers. While the phrase "multi-stage fluid bed reactor" is not used anywhere in the patent, the apparatus is a multi-stage unit.

In Schlamersdorf, U.S. Pat. No. 3,886,895, there is described an apparatus for treating particulate matter while in a fluidized state. This patent does not deal with multi-stage fluid beds. It concerns a plurality of single fluidized beds, "each of which operates in a substantially independent manner". In a multi-stage fluid bed, each stage is fed with powder from the stage prior to it and does not operate independent of each other.

The present invention provides advantages heretofore unavailable in previously available single and/or multi-stage fluidized bed reactors.

SUMMARY OF THE INVENTION

The present invention is thus directed to an apparatus useful for fluidizing small particulate solids, i.e., solids having a diameter of less than about 50 microns in average particle size, and at least partially enveloping these small solids with a coating material or a precursor thereto, said apparatus comprising in combination:

a cross-current multi-stage fluid bed reactor having N fluid beds in flow communication with one another, wherein $N \geq 2$;

means for introducing small solid particles to a bed selected from the N beds of the reactor;

means for introducing a fluidizing gas to the N beds of the reactor, thereby promoting a flow of the small solid particles from the first bed through bed # N of the multi-stage fluid bed reactor;

means for introducing a coating material or a precursor thereto, to one or more of the N beds of the reactor;

means for distributing the coating material or precursor thereto throughout the cross-section of the reactor beds containing the same;

means for controlling the residence or contact time of the small particulate solids in the beds containing the coating material or the precursor thereto, such that the small particulate solids therein are at least partially enveloped by the coating material or precursor thereto; and one or more exit means for removal of the fluidizing gas and the small solid particles at least partially enveloped by coating material or precursor thereto.

In a preferred embodiment of the present invention, the small particulate solids to be fluidized have a diameter of less than about 35 microns in average particle size.

More preferably, the small particulate solids to be fluidized have a diameter of less than about 20 microns in average particle size.

Preferably, the value of N, the number of fluid beds or stages in the multi-stage reactor, is from 2 to 10, more preferably, N is 4.

Another embodiment of the present invention is directed to a batch process for coating small solid particles with a conformal coating of a protective material, said method comprising the steps of:

(a) contacting the small particles with a vapor phase precursor coating material in a first multi-stage fluid bed reactor, such that the particles adsorb at least a portion of said precursor coating material;

(b) passing the particles having precursor coating material adsorbed thereon to a second multi-stage fluid bed reactor wherein said precursor coating material is oxidized to a protective material;

(c) passing said coated particles to a cooling zone; and (d) recirculating the solids through the first and second multi-stage fluid bed reactors and the cooling zone, an appropriate number of times, to achieve a thicker coating of the protective material.

Yet another embodiment of the present invention is directed to a continuous process for coating small particles with a conformal coating of protective material, optionally doped with a metal or other dopant, said process comprising the steps of:

(a) feeding solids at a controlled rate to a first multi-stage fluid bed reactor, wherein the solids are contacted with a precursor material and an optional dopant; and (b) passing the solids to a second multi-stage fluid bed reactor, wherein the solids are cooled; and (c) collecting the coated and cooled solids from the exit of the last stage of the second multi-stage reactor.

These and other aspects of the present invention will be appreciated more fully when considered in view of the attached drawings and the detailed description which follow.

DETAILED DESCRIPTION OF THE PREFERRED EMBODIMENTS

In its broadest aspect, the present invention is directed to a novel multi-stage fluid bed reactor. This apparatus consists of N stages (wherein N is an integer greater than one), each stage separated from another by a baffle. The reactor is preferably prepared from an alloy having good mechanical strength and thermal transport properties at elevated temperatures. Advantageously, the reactor may be coated with a thin film (4 to 10 mils) of a wear resistant coating.

The apparatus of the present invention may be easily adapted to perform a very broad variety of tasks including but not necessarily restricted to cooling of hot powders, heating of cold particles, annealing virgin and/or coated phosphor particles, adsorption of precursors on phosphor surfaces, reactions of adsorbed films or chemical vapor deposition on phosphor surfaces, and the like. Upon consideration of this specification, the skilled artisan will recognize the many utilities presented by the apparatus of the present invention.

For example, two or more of these units, each performing a different task, may be connected to yield a viable coating or reaction process. Optimization of individual process steps would be possible without the adverse coupled effects present in existing reactor designs, leading to better product quality and decreased sensitivity to changes in feed conditions.

Figure 1:
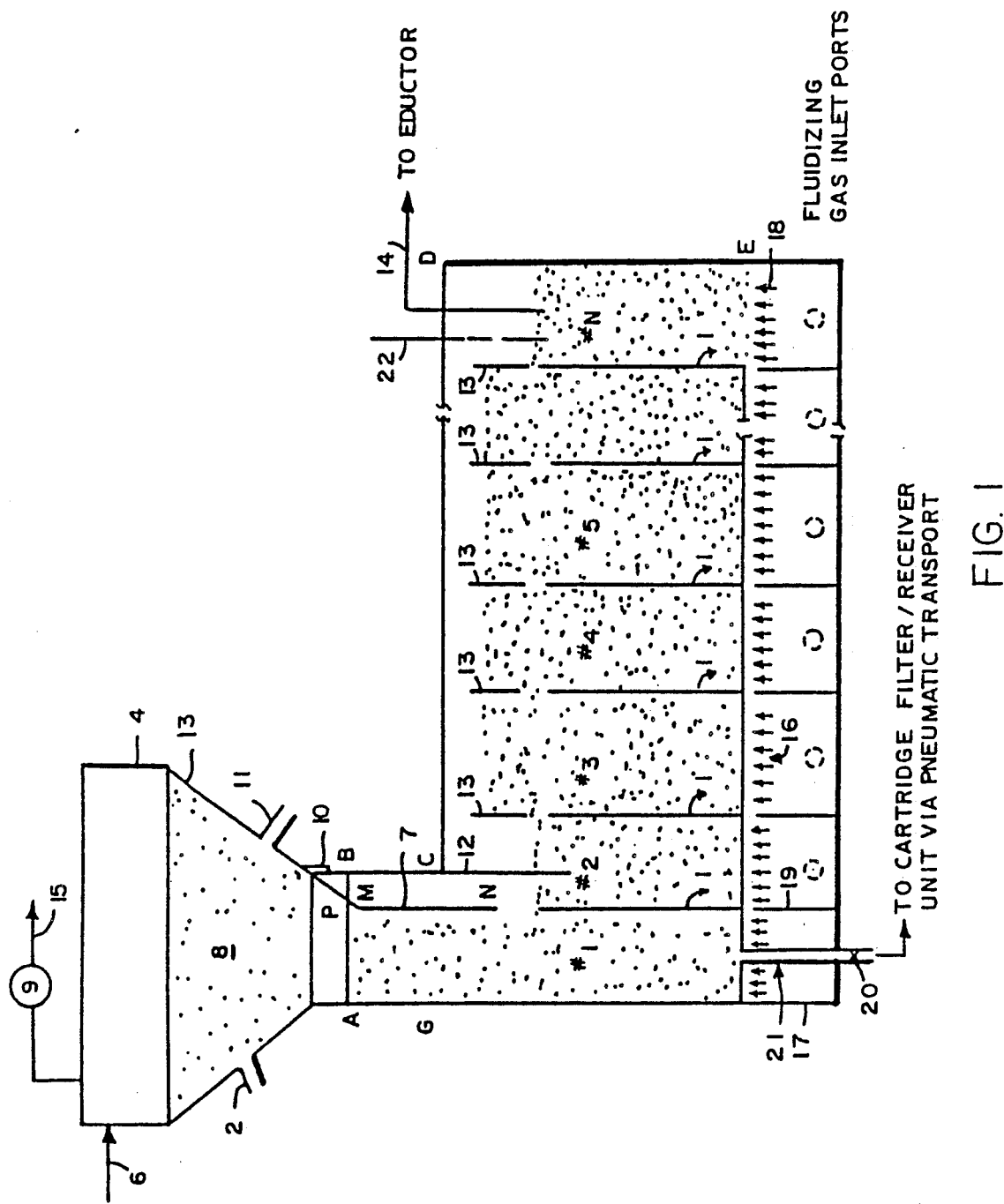
FIG. 1 is a schematic representation of a multi-stage fluid bed reactor apparatus of the present invention.

A schematic of the basic apparatus of the present invention is shown in FIG. 1. One particularly advantageous use for this apparatus is the adsorption of protective coating precursors and the subsequent reaction of such adsorbed films on the surfaces of phosphor particles to yield a protective film. Various embodiments applicable to other processing capabilities are discussed below.

Referring in detail to FIG. 1, the outlined area labeled "ABCDEFGA" is the shell of the multi-stage fluid bed reactor. The material of construction is advantageously an alloy with good mechanical strength and thermal transport properties at elevated temperatures. Inconel 601 satisfies these requirements but is not necessarily the only material that may be used. Those of ordinary skill in this art will readily be able to substitute equivalent or superior materials depending upon their particular requirements.

To prevent contamination of the phosphor by metals in the alloy due to abrasion, the alloy is advantageously coated by a very thin film (4 to 10 mils) of a wear resistant coating. The coating used in this embodiment of the present invention is preferably alumina, although chromium oxide and other wear resistant materials may also be suitable. Although alumina is a poor conductor compared to the Inconel, the very small thickness of the former has negligible influence on the rate of heat transfer through the side walls of the reactor shell.

As illustrated in FIG. 1, the multi-stage fluid bed reactor of the present invention consists of "N" stages, each separated from the previous one by a baffle, 1. As defined above, N is an integer greater than or equal to 2. It follows that the number of baffles is N−1. The baffles are preferably made of Inconel and coated with a thin coating of alumina.

As the artisan will appreciate, the height of the baffles, the number of stages, the depth of the reactor and the width of each stage depend primarily on the kinetics of the reaction to be conducted in the reactor, the bed-wall heat transfer coefficient, the temperature profile for optimum reaction selectivity and yield and the phosphor circulation rate.

Requisite heat transfer area is provided in the present apparatus by the width and number of stages used in the fluid bed reactor. The depth of the apparatus, which is the distance in the direction of heat transfer, is flexible in that it is not too small to cause manifestation of hydrodynamic wall effects yet not too large for transverse temperature gradients to become important. The use of higher values of gas superficial velocity lead to economically acceptable phosphor circulation rates (and product thruputs) besides increased heat transfer coefficients.

To describe the apparatus in action, it will be assumed for discussion purposes only, that this reactor is a unit in a phosphor coating process. Thus, the reactor of FIG. 1 receives phosphor with an adsorbed film from an upstream processor. This is achieved via duct 2, which feeds a two phase phosphor/gas mixture into a hopper, 3. The hopper, 3, and the rectangular cross sectioned box, 4, above it are made of stainless steel and coated with a material having a low coefficient of sliding friction, e.g., TFE Teflon. The section 4 houses high temperature filters, 5, made of Nomex, fiberglass, metal alloys, and the like, which separate the incoming phosphor, and any entrained phosphor from the fluid beds below, from the gas phase. The clean gas is pulled by a blower, 9, and discharged to the atmosphere via line 15.

At selected time intervals, preferably varying from about 10 to about 30 seconds, the filters are blown down by reverse jets of cleaning air fed to the system via line 6. The phosphor dislodged from the filters travels down the walls of the hopper, 3, to the first stage of the fluid bed reactor. This is made possible by a metal plate LP welded to the connector, 10, which extends to an inclined plate PM and a vertical plate NM. These last two plates, referred to as item 7 in FIG. 1, are located between the side walls of the reactor shell. The length LM is inclined to the horizontal at the same angle as the hopper side wall, to provide a continuous low angle for phosphor downflow.

The spacing between the top of the first fluid bed baffle, 1, and the bottom of the plate NM allows for both the thickness of the powder layer above the baffle, 1, and the flow of gas above this layer. The hopper walls are advantageously positioned at angles greater than the angle of repose of the phosphor to promote flow of the material to the reactor below. The hopper coating, besides preventing phosphor contamination by steel, also helps in the powder transport by its low coefficient of sliding friction, In addition, an electromechanical vibrator, 8, is located on the hopper side wall. The broad band vibration from this unit contributes to phosphor movement by lowering even further the drag between the phosphor and the coating.

The hopper, 3, is flanged to a connector piece, 10. This connector is jacketed to allow the flow of cooling water. Hot phosphor particles ejected from the fluid beds transfer heat to the cooling water stream. In addition, cooling air of appropriate psychrometric properties is drawn into the hopper,3, via duct 11 by the action of the blower, 9. The combined action of the cooling air, the cooling jacket and thermal losses to the cooler room atmosphere, help to keep the collection filters at an acceptable temperature.

Baffle 12 is connected to the roof CD of the reactor shell. The lower end of this baffle extends below the level of the top of baffle 1. This prevents the phosphor exiting the lower end of the hopper, 3, from short circuiting to the exit tube, 14, which has a negative pressure downstream due to an eductor. The eductor arrangement may be used to transport product from this reactor to a downstream unit for any subsequent processing.

Baffles, 13, are located above baffles 1. All baffles are integrally connected to the side walls of the reactor shell. There is a space between the baffles, 13, and the reactor shell top CD. Space is also provided between the top of baffles I and the bottom of baffles 13. The latter space is designed to accommodate the thickness of the phosphor layer (above the baffles 1) flowing from bed #1 to bed #N under the influence of the fluidizing gas 16. A fraction of the fluidizing air volume makes its way via the space at the top of baffles 13 to provide the transport gas for the phosphor exiting via tube 14. The spacing also promotes high gas velocity past the reactor shell top CD and prevents accumulation of powder in that region. The balance of the fluidizing air makes its way via the holes drilled in baffle 12 to the hopper 3 and subsequently out to the atmosphere via line 15.

The reactor is heated, preferably by externally positioned Globar ® (Sohio Carborundum) silicon carbide elements which transfer heat (mostly radiative) to the outer side of the shell. This heat is then conducted through the wall whence it is transferred to the phosphor in the fluid beds. The effective heating length of the Globar ® silicon carbide elements is comparable to the height of the baffles 1. The widths of the N stages need not be identical and is dictated by process conditions as described above.

Fluidizing gas 16 enters the plenum, 17, which is separated into chambers by partition plates, 19. The gas is subsequently distributed via a porous distributor plate, 18, of appropriate permeability to the N stages of the reactor. At the end of a run, powder in the beds may be pneumatically conveyed to a cartridge filter/receiver unit via tubes 21 welded to the distributor plate, 18. FIG. 1 shows one of N such product withdrawal tubes. The distributor plate 18 and the plenum chamber 17 form an integral assembly which may be separated from the reactor shell if needed, for example, for plate cleaning. This provides significant flexibility of operation.

Small samples of product for analysis may be withdrawn, during the progress of a run, from the last stage of the fluid bed reactor via a tube 22 inserted into the bed from the top of the reactor shell. This tube is closed at its bottom and has a port on its side for entry of powder. The location of the port above the bottom of the tube is governed by the desired sample size. This method of sampling is a very attractive feature in that it allows monitoring of the process with time.

The fluidizing gas reacts with the adsorbed film on the phosphor surface in the fluid beds. This converts the adsorbed film to the desired coating on the phosphor surface. The reactor is designed so that all the phosphor particles reside in the system for almost the same period of time. This affords and assures uniform product quality.

This apparatus may be easily extended to cover a variety of tasks different from those described herein. For example, cooling of the hot phosphor may be conducted in a similar apparatus, without using the Globar ® silicon carbide elements, e.g., by using air as the fluidizing/cooling gas. Phosphors at room temperature may be heated to an elevated temperature by processing in an apparatus very similar to that shown in FIG. 1.

All particles exiting a fluid bed reactor do not spend the same time in the system. The length of time spent by a particle in the reactor is referred to as its residence time. Some particles have a longer residence time than the mass weighted mean residence time, and others have less. The residence time distribution, E(t), of the exiting solids describes the residence times for the population of particles. If all the particles were to have identical residence time, the solids would be considered to be in plug flow. This flow pattern would lead to the most uniform product quality.

Figure 2:
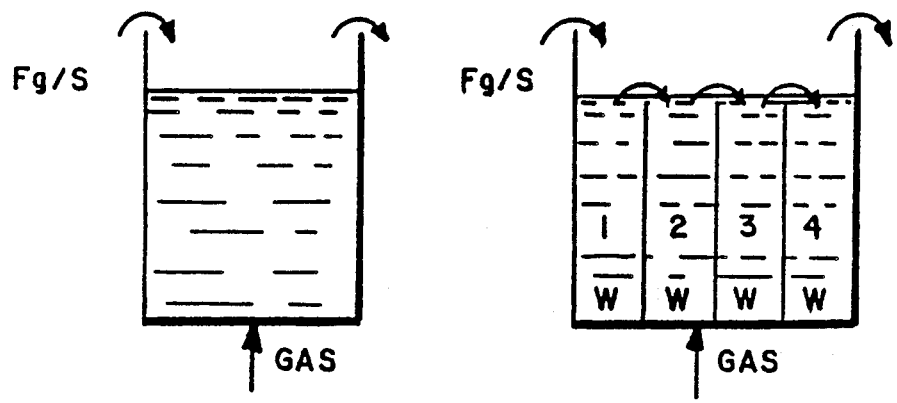
FIG. 2 illustrates the mathematical basis behind the design of the multi-stage fluid bed reactors of the present invention. In addition, two reactor types are illustrated. The left hand diagram depicts a single fluid bed while on the right is a schematic of an "N" stage fluid bed reactor. herein N=an integer greater than or equal to 2.

One of the very attractive features of a multi-stage fluid bed reactor as compared to a single fluidized bed unit, is that E(t) for the former can be made to approach that for plug flow. FIG. 2 compares E(t) for the two systems The following symbols are used in FIG. 2:

E(t)dt: fraction of exiting phosphor which has spent time between t and t+dt in the reactor.

F: feed rate of phosphor to reactor.

N: number of stages.

W: mass of phosphor in the single fluid bed, or in each stage of the multistage reactor.

t: time $\bar{t}$: average residence time of phosphor in the single fluid bed, or in each stage of the multistage reactor.

$\phi$: dimensionless time, $t/\bar{t}$

Expressions for E(t) are taken from Kunii and Levenspiel. While the diagram refers to N equal sized beds in the multi-stage reactor, it should be noted that E(t) can easily be derived for N nonequal sized beds too. These expressions for E(t) assume well stirred behavior for the fluid beds. Deviation from well stirred behavior is possible while fluidizing cohesive powders if effective fluidizing aids are not used. Small amounts of highly dispersed alumina, for example, has been shown by Dutta and Dullea ("Fundamentals of Fluidization and Fluid Particle Systems," Session 163, *AIChE Annual Meeting*, (Dec. 1, 1988) to be an effective fluidizing aid for phosphors.

It follows from the E(t) expression in FIG. 1, that a single fluid bed suffers from a very broad distribution of residence time. A sizable fraction of input material to such a reactor has a very small residence time, which leads to unacceptable reaction levels in the produce exiting the unit. Addition of a second bed in series with the first, forming a multistage fluid bed reactor with N=2, improves the situation considerably. As N increases, the bypassing problem inherent in a single fluid bed is reduced.

In the limit of a large value of N, E(t) approaches that for plug flow. In reality, it is impractical to use a very large number of stages because of structural problems involved in the support of a long distributor plate. In addition, good control over the distribution of gas to a very large number of stages becomes complicated. In the most preferred apparatus design of the present invention, four stages (N=4) have been used in each fluid bed reactor. The number of stages used in an application is an implicit function of several process parameters, as will be readily apparent to those of ordinary skill in this art.

In order to carry out the phosphor coating, the phosphor particles need to have a residence time of $t^*$, which can be obtained from a knowledge of the process kinetics. The fraction of exiting phosphor which has a residence time less than $t^*$ has to be minimized to obtain an acceptable product quality. This fraction, referred to hereafter as f, is the integral of E(t) with respect to time from t=0 to t=t*. A very attractive consequence of the fact that E(t) for a multistage fluid bed reactor is much more uniform than that for a single fluid bed, is that the former reactor is considerably smaller than the latter unit for the same phosphor feed rate and f.

The significant size reduction on multi-staging is clearly shown in Table 1, for f=0.5%. The total phosphor inventory in the reactor decreases substantially as multi-staging is initiated (N=2) and keeps on falling as N increases though not as fast. A smaller powder inventory means a smaller reactor. With N=4, the phosphor mass in the reactor would merely be about 3% of the corresponding value for a single stage (N=1). This is a very advantageous feature when handling industrially important cohesive powders, where large reactor dimensions typically cause fluidization problems in terms of deficiencies in heat and mass transfer.

In summary, multi-staging is distinctly superior to single fluid bed operation because the former provides a much more uniform distribution of solids residence times, and allows for a much smaller reactor size.

TABLE 1
EFFECT OF MULTI-STAGING
ON REACTOR PHOSPHOR INVENTORY

| N | f | Design variable f = 0.005 | $\phi$ |
|---|---|---|---|
| 1 | $1 - e^{-\phi}$ | | 0.005 |
| 2 | $1 - (1 + \phi)e^{-\phi}$ | | 0.1035 |
| 4 | $1 - \left(1 + \phi + \dfrac{\phi^2}{2} + \dfrac{\phi^3}{6}\right)e^{-\phi}$ | | 0.672 |

$\phi$ increases rapidly with number of stages

| N | Total Phosphor Inventory (NtF) | |
|---|---|---|
| 1 | 200t*F | (100) |
| 2 | 19.32t*F | (9.67) |
| 4 | 5.95t*F | (3.0) |

Multistaging reduces significantly the phosphor inventory needed in the system

As described above, the apparatus of the present invention is particularly designed and adapted to processes for coating phosphor particles. Clearly such processes may either be batch processes or continuous processes, depending upon how the systems are connected.

Fluidized beds processes generally entail the passage of a gas upwardly through the particles to be suspended, thereby suspending them in the gas stream. The apparatus of the present invention may use either an inert gas, or a reactive gas as the suspension means. Examples of inert gases suitable for use in this method include nitrogen, argon, helium, neon, or mixtures thereof One example of a reactive gas is air.

Examples of protective phosphor coating materials that can be applied by the methods of the present invention include metal or non-metal oxides. Preferred coating materials are the refractory oxides, such as aluminum oxide or yttrium oxide. For a chemical compound or chemical composition to be suitable for use as coating precursor material in the method of the present invention, the compound or composition must be volatilizable. Organometallic compounds and/or organocompounds of a nometal which are volatilizable under the conditions of the method may be used as coating precursor materials in the present invention.

For example, some suitable aluminum oxide precursor materials are represented by the general formula $AlR_x(OR')_{3-x}$ wherein $0 \leq x \leq 3$ and x is an integer, and R and R' are lower alkyl groups, such as: $-CH_3$; $-C_2H_5$; $-C_3H_7$; or $-C_4H_9$. Examples of suitable yttrium oxide precursor materials are represented by the general formula $R_x(OR')_{3-x}Y$ wherein $0 \leq x \leq 3$ and x is an integer, and R and R' are lower alkyl groups, such as $-CH_3$; $-C_2H_5$; $-C_3H_7$; $-C_4H_9$; or $-C_5H_{11}$.

The most preferred aluminum oxide precursor for use in the present invention is the organometallic reagent, trimethyl aluminum (TMA).

The above listing of examples of suitable coating precursor materials is not to be construed as necessarily limiting thereof. Any suitable compounds which can be vaporized into the suspension gas under the conditions of the present method may be used as coating precursor material herein.

Figure 3:
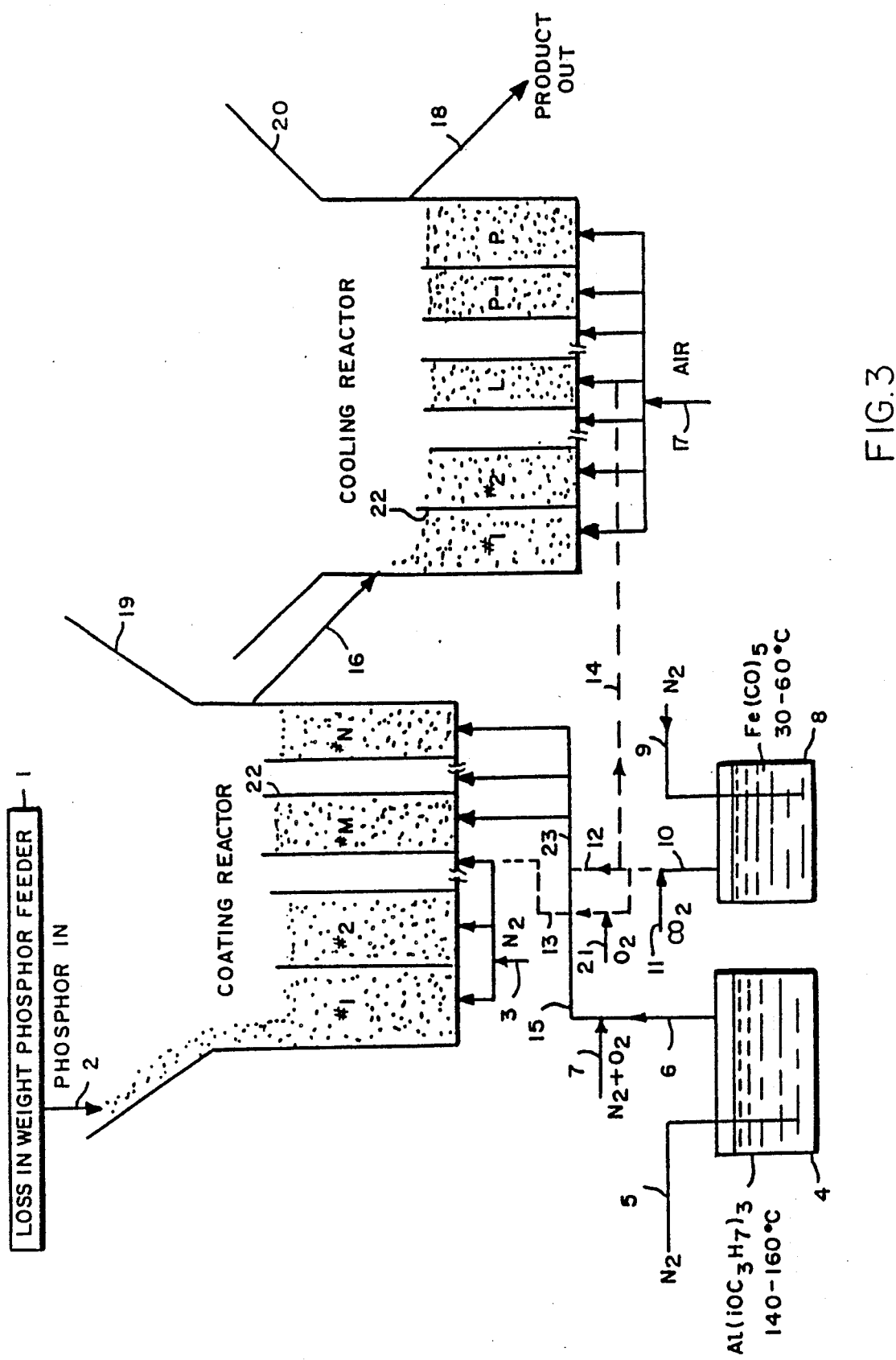
FIG. 3 is a schematic representation of two multi-stage fluid bed reactors of the present invention connected in series, one serving as a "coating" reactor and the other serving as a "cooling" reactor. Continuous process steps for coating a small particulate solid with $Al(iOC_3H_7)_3$ with or without $Fe(CO)_5$ are also provided.

FIG. 3 illustrates an arrangement of two multi-stage fluidized bed reactors of the present invention arranged to perform a continuous coating process. FIG. 3 also illustrates one preferred embodiment of a two-part (i.e., linked) multi-stage fluid bed reactor of the present invention.

Referring in detail to FIG. 3, it will be noted that the beds constituting a reactor are approximately equal in size, but need not equal the size of those in the other reactor. Each bed of both multi-stage units operates isothermally. Baffles 22 separate adjacent beds in the two multi-stage reactors. The number of stages in the two reactors need not be identical and is determined by process considerations.

In this description, the upstream reactor is called the "coating reactor" and the downstream multi-stage unit is referred to as the "cooling reactor". It is pointed out that the names employed do not necessarily restrict use of these units to those functions only. In fact the "cooling reactor" may be used for both cooling and coating.

Phosphor is fed via line 2, preferably at a constant mass rate to bed #1 of the coating reactor, e.g., using a microprocessor controlled loss in weight feeder.

Referring again to FIG. 3, phosphor entering the "coating reactor" is progressively heated as it moves from one bed to the other. In this embodiment, the major contribution to the heating is convection and also radiation from the walls of this reactor The walls in turn are heated, preferably by a silicon controlled rectifier (SCR) Globar ® arrangement.

The fluidizing gas for the beds #1 through #M-1 which have temperatures below about 500° C. is an inert gas such as nitrogen, fed via line 3. For the remaining beds in this reactor, #M through #N, which operate at temperatures around or above about 500° C., the fluidizing medium fed through line 15 is nitrogen mixed with aluminum alkoxide vapor and oxygen. To achieve this fluidizing mixture, nitrogen via line 5 is bubbled into a reservoir 4 containing aluminum alkoxide liquid at a temperature between about 140° to 160° C. The flow rate of nitrogen in line 5 is a function of the phosphor throughput, the particle surface area, desired coating thickness of alumina, the temperature and pressure in vessel 4 and the saturation factor of stream 6.

Alkoxide vapor is transported via line 6 and appropriate flows of nitrogen and oxygen are added through line 7 to obtain the stream 15 which fluidizes the beds #M through #N. In these beds the aluminum alkoxide undergoes chemical vapor deposition in the presence of oxygen to form a coating of alumina on the surface of the phosphor particles. Disengagement of entrained phosphor particles is provided by appropriate freeboard 19 design.

Advantageously the apparatus is further designed to allow for the cooling of the distributor plate of the first reactor, e.g., via a set of pipes in the distributor plate through which a coolant fluid is circulated, thereby maintaining the temperature thereof below the decomposition temperature of the coating precursor.

The phosphor particles coated with alumina travel down tube 16 which connects the last bed #N of the coating reactor to the first bed #1 of the cooling reactor. This tube is preferably inclined at an angle greater than the angle of repose for the phosphor of interest to facilitate inter-reactor solids transport. The tube 16 is sized to handle the desired phosphor throughput.

In the cooling reactor the hot phosphor is cooled by heat transfer to the fluidizing gas, e.g., air, introduced via line 17. Each bed of this reactor is isothermal and the solids temperature decreases progressively as the phosphor moves form bed #1 to the last bed #P. P may or may not equal N depending on process considerations. The cooling reactor is designed such that the last bed temperature is in the range of 70° to 100° C. Product is continuously withdrawn from bed #P via line 18. This line is advantageously sloped at an angle exceeding the angle of repose of the phosphor Any solids ejected from the surface of the beds of this reactor are disengaged from the gas stream in the diffuser shaped freeboard 20, which is designed in accordance with the hydrodynamics of gas-solid flow.

Doping of alumina by Fe(III) is achieved by simultaneous chemical vapor deposition (CVD) of alumina and ferric oxide. Stream 12 is connected to stream 15 resulting in stream 23 which now fluidizes beds #M through #N of the coating reactor. The generation of stream 15 has been described earlier. Stream 12 is a combination of streams 11 and 10. Stream 11 contains carbon dioxide which helps in the CVD of ferric oxide. Stream 10 is a mixture of nitrogen via line 9 through a vessel 8 containing iron pentacarbonyl liquid at a temperature of about 30° to 60° C. The rate of flow of nitrogen through line 9 is based upon the desired dopant concentration of iron(III) in the coating, the temperature of the pentacarbonyl, the overall temperature and pressure of the vessel 8, and the degree of saturation of stream 10. In the beds #M through #N, the aluminum alkoxide and the iron pentacarbonyl vapors undergo CVD at the phosphor surface to form a coating of alumina doped with iron.

If it is desired to form a coating of iron oxide on the phosphor surface before, or instead of laying on the alumina, stream 13 containing a mixture of the pentacarbonyl vapor in nitrogen, oxygen and carbon dioxide is introduced into that stage or stages of the coating reactor which have temperatures around 200° C. but less than 500° C. The organometallic precursor undergoes CVD at the phosphor surface to form the hard, semitransparent coating of iron(III) oxide. If alumina is also desired, stream 15 is introduced in stages #M through #N to form alumina by CVD on the iron oxide surface.

While iron has been exemplified as a dopant in this figure, other metals selected from the elements in the Groups IA, IIA, IIIA, IVA, VA, VIA, VIIA, VIIIA, IB, IIB, IIIB, IVB, VB, VIB and VIIB of the Periodic table may be used as dopants herein.

Again if it is desirable to lay an overcoat of iron oxide over the alumina, no pentacarbonyl is introduced into the coating reactor. The phosphor is coated with alumina in the coating reactor as described above, while the pentacarbonyl vapor with nitrogen is introduced via stream 14 to that stage or stages #L, #L+1 etc. of the cooling reactor where the temperatures are around 200° C. In this stage or stages the pentacarbonyl undergoes CVD at the alumina surface to form an overcoat of ferric oxide. The cooling of the phosphor still continues so that the solids reach a temperature in bed #P of the cooling reactor suitable for product withdrawal.

Another embodiment of the present invention is a batch process for applying a coating to individual phosphor particles which comprises depositing a protective coating on individual phosphor particles in three independent steps; (a) adsorption of a coating precursor by the phosphor particles; (b) oxidation of the precursor to the final protective coating; and (c) cooling of the oxidized/coated particles.

Figure 4:
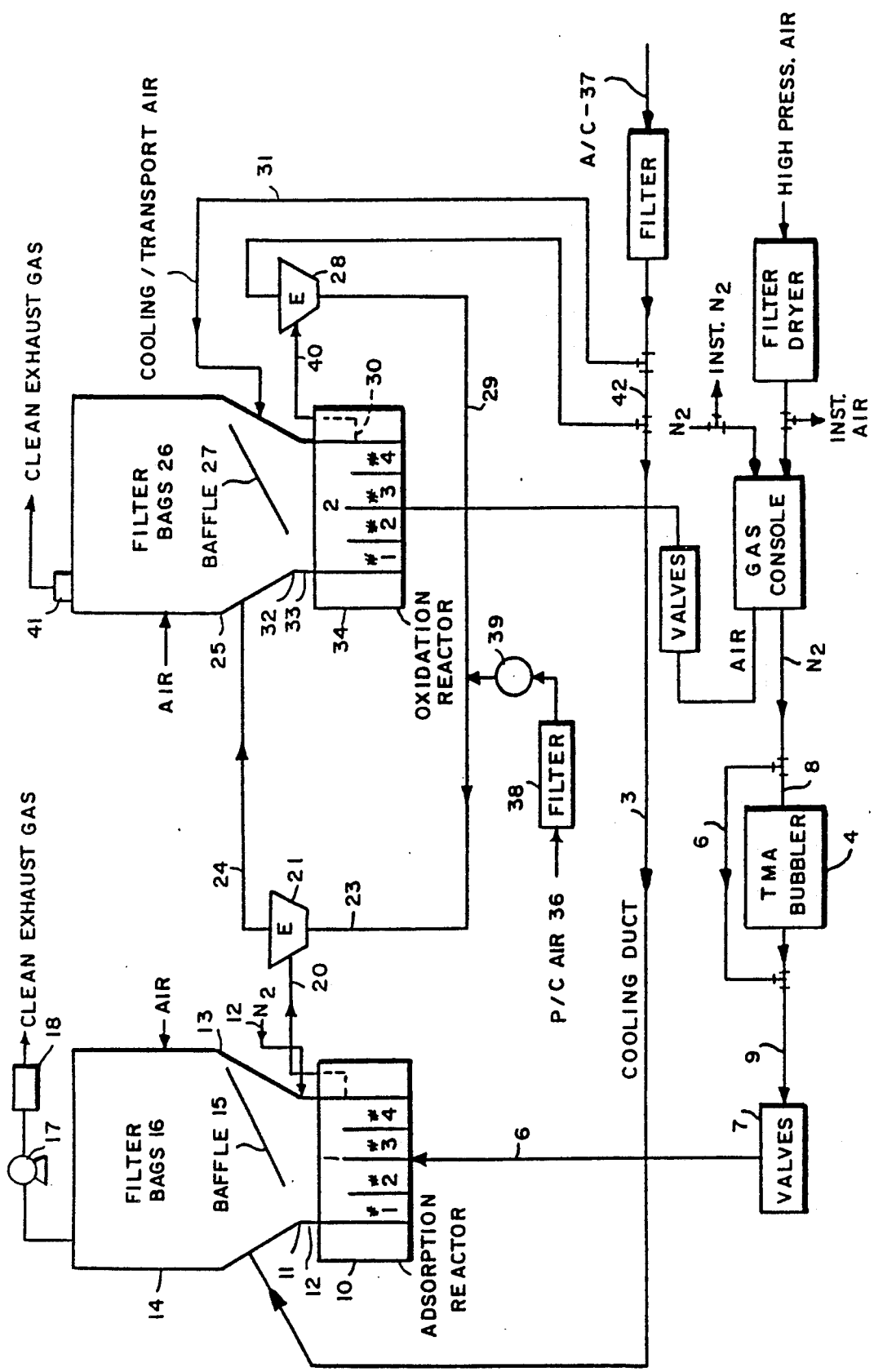
FIG. 4 is a schematic representation of two multi-stage fluid bed reactors of the present invention connected in series, one serving as an "adsorption" unit, the other serving as an "oxidation" unit. Batch process steps for coating a small particulate solid with TMA are also identified.

As illustrated in FIG. 4, the phosphor particles are circulated between an adsorption reactor, an oxidation reactor, and a cooling region, for a sufficient number of times to achieve a conformal coating of the desired thickness. Air is typically used in this process as the circulating medium and because of the oxygen therein, it serves as the oxidant in the oxidation reactor, where it reacts with the coating precursor material, TMA (trimethylaluminum).

Referring in detail to FIG. 4, phosphor is exposed to a mixture of nitrogen gas and TMA vapor in a four stage fluid bed reactor 1 also referred to as the adsorption reactor in the figure.

Advantageously, the range of operating temperatures for the adsorption reactor should be such that acceptable adsorption rates are achieved without sacrificing the equilibrium adsorption amount. In addition, temperatures preferably should be less than about 200° C. to prevent pyrolysis of the TMA.

Phosphor from bed 4 of reactor 1 has TMA adsorbed on it, and is transported to a second four stage fluid bed unit 2 where it is progressively heated and fluidized with dry air, and oxidized to form a coating of alumina on the external surface. This unit 2 is also called the oxidation reactor in the figure. Hot phosphor from bed 4 of reactor 2 is transported to a cooling duct 3.

The gas mixture in tube 6 which is fed to the controlled porosity distribution plate of reactor 1 contains nitrogen and TMA vapor. The partial pressure of TMA vapor in this mixture can vary from about 1 to 10 mm of Hg. The distribution of TMA to the four beds of unit 1 is controlled by a set of valves 7. Superficial velocities of nitrogen for the four beds of reactor 1 can range from about 5 to 15 cm/s at operating temperatures. TMA vapor is picked up by passing nitrogen in tube 8 into a bubbler 4 containing TMA liquid. This bubbler is surrounded by a silicone oil heating bath and is maintained at temperatures from about 30° to 80° C. Desired fluidization velocities are achieved by flowing appropriate amounts of nitrogen in tube 5 which mixes with the carrier nitrogen+TMA vapor in tube 9.

The adsorption reactor 1 consists of four fluid beds in series. Each bed is separated from the next by a Crystar ® (Norton's recrystallized silicon carbide) baffle 35, and each bed has approximately the same fluidizing cross sectional area. The two ends of the fluid bed reactor are of cast high alumina refractory. The two sides of unit 1 are of Crystolon ® (Norton's high thermal conductivity silicon carbide). Bonded to the outside of these Crystolon ® plates are resistive strip heaters. Thermal insulation is placed on all sides of reactor 1 to minimize heat loss to the surroundings. A stainless steel shell 10 holds reactor 1 in place and lends structural integrity. Connected to the top of the shell 10 and having an opening which matches that of the fluid bed reactor 1 is a stainless steel connector 11. A rectangular slot 12 is available on one end of connector 11. During the coating operation this slot is covered by a plate. After the coating is over, this slot is opened and the coated phosphor is removed from the four beds by a pneumatic conveying system.

Bolted to the connector 12 is a stainless hopper 13 which has a stainless steel baffle 15 attached to its sides. A stainless steel box 14 is bolted to the top flange of hopper 13. High temperature Nomex filter bags 16 are mounted inside box 14. Phosphor is cooled to about 150° to 200° C. by the time it reaches the end of the cooling duct 3. At this point the phosphor together with its transport air enters the hopper 13. The phosphor laden air stream is cleaned of its solid content by the filter bags 16 and the clean air is transported by a blower 17 via an attenuator 18 to the environment. The phosphor falls down onto the baffle 15 which is positioned such that its tip extends into a region slightly to the left of the baffle separating bed #1 from bed #2, thereby guiding the particles into bed #1. The phosphor particles move from bed #1 to bed #4 under the action of the fluidizing nitrogen and progressively adsorb the TMA vapor being fed to reactor 1.

Conditioned air 36 with desired psychrometric properties is fed via a filter unit 38 to a compressor 39. The compressed air at pressure levels ranging from about 5 to 10 psig is delivered to the nozzle of an eductor 21 via line 23. The resulting suction head draws phosphor from bed #4 of reactor 1 via a cast hole 19 and a glass tube 20 into the side entry port of the eductor 21. Carrier gas for this phosphor transport is provided by a nitrogen flow 22, fed above fluid bed #4 through the connector 11. The discharge stream from the eductor flows through line 24 to the hopper 25 associated with the oxidation reactor 2.

The filter bags 26 above reactor 2 separate the phosphor from the carrier gas stream. The gas is pulled by a blower 41 and discharged to the environment. The phosphor particles drop to the baffle 27 and make their way to bed #1 of the oxidation reactor 2. This unit consists of four fluid beds in series; the baffles between the beds are each about the same height and the material of construction is Crystar ®. The fluidization medium is air with a pressure dew point of about −40° C. Air superficial velocities range from about 5 to 15 cm/s at operating conditions. The oxidation reactor 2 has a stainless steel shell 34 to which is attached a water cooled stainless steel connector 32. On one end of the connector 32 is a rectangular slot 33 which is kept closed during the coating operation. After the batch is completed, the slot is opened to remove product from the four beds by pneumatic transport.

The two ends of reactor 2 are of cast high alumina refractory. The two sides are constructed of Crystolon ® silicon carbide plates behind which are positioned Globar ® silicon carbide elements to form a three zone furnace. Crystolon ® plates are positioned behind the Globar ® silicon carbide elements also. Zones 1 and 2 of the Globar ® silicon carbide elements heat beds #1 and #2 respectively while the third zone delivers its heat load to beds #3 and #4. The heating is advantageously regulated by dedicated three mode temperature controllers which feed control signals to a firing package in a SCR controlled power supply.

As the phosphor moves from bed #1 to bed #4 under the influence of the fluidizing gas, the TMA adsorbed on the surface of these particles is progressively converted to alumina. Each bed is approximately isothermal with temperatures increasing from about 250° C. in bed #1 to about 500° C. in bed #4. It is important to carefully control the temperature profile in reactor 2 since too high an initial temperature will lead to unacceptable levels of carbon species in the coating.

Air leaving the compressor 39 at pressure levels of about 5 to 10 psig is fed via line 29 to the nozzle of eductor 28. The vacuum thus created draws hot phosphor from bed #4 through a cast hole 30 on one end of reactor 2, and via stainless pipe 40 to the side entry port of the eductor 28. The hot phosphor is discharged from the eductor 28, positioned concentric to the duct 3 and inside it, into a stream of air conditioned air 42. The inlet air stream 37 to the duct 3 is controlled in temperature and relative humidity, and pneumatically transports the phosphor in the stainless steel duct 3 at velocities exceeding the saltation velocity. As the phosphor moves down the duct 3 the particles get cooled by heat transfer to the carrier air stream. The temperature of the phosphor particles at the end of the duct 3 is about 150° to 200° C. A flow of conditioned air 31 with an upper limit of about 0.04 cubic meters/s is fed to the hopper 25 to reduce the temperature of the gas and particles in the freeboard of reactor 2 to a temperature acceptable to the Nomex bags 26.

After the phosphor enters hopper 11 at the end of its journey through duct 3, the sequence of the three steps (adsorption, oxidation and cooling) is repeated. The desired coating thickness is achieved by circulating the phosphor through the system an appropriate number of times. The phosphor circulation rate is a complex function of several variables and is derived from a heat balance around reactor 2. The feed rate of TMA to reactor 1 is dependent upon this circulation rate, among other things.

To start up the process the fluidizing nitrogen and air to reactors 1 and 2 respectively are switched on. The blowers 17 and 41 of the two bag filter units are also pressed into service, as is the supply of conditioned air 37, 36 and 31 to the duct 3, compressor 39 and hopper 25 respectively. The side port of eductor 28 is rotated 90 degrees counterclockwise from its position during the coating operation. A flexible hose is connected from this port to a vessel containing about 25 kg of the phosphor. The vacuum created draws phosphor up the hose into the duct 3 where it is pneumatically transported by the airstream to reactor 1, and subsequently to reactor 2 via eductor 21. The rate of feed of phosphor to the duct 3 is controlled by a butterfly valve on the feed line. Once the container is empty the eductor 28 side port is turned back to its default position. Phosphor is now conveyed from bed #4 of reactor 2 to duct 3, and back to reactor 2 via unit 1. With this circulation achieved, the oxidation Globar ® silicon carbide elements are switched on and controls activated to attain desired operating temperatures in various regions of the process. After this point, the TMA feed to reactor 1 is started.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of coating small solid particles with a conformal coating of a protective material, said method comprising the steps of:
    (a) contacting the small particles with a vapor phase precursor coating material in a first multi-stage fluid bed reactor, such that the particles adsorb at least a portion of said precursor coating material;
    (b) passing the particles having precursor coating material adsorbed thereon to a second multi-stage fluid bed reactor wherein said precursor coating material is oxidized to a protective material;
    (c) passing said coated particles to a cooling zone; and
    (d) recirculating the solids through the first and second multi-stage fluid bed reactors and the cooling zone, an appropriate number of times, to achieve a thicker coating of the protective material.

2. The process of claim 1 wherein the fluidizing gas in the first multi-stage fluid bed reactor is nitrogen.

3. The process of claim 1 wherein the precursor coating material is a precursor of alumina.

4. The process of claim 3 wherein the precursor of alumina is trimethyl aluminum.

5. The process of claim 3 wherein the precursor of alumina is $AlR_x(OR')_{3-x}$ wherein $0<2x<3$ and x is an integer, and R and R' are lower alkyl groups.

6. The process of claim 1 wherein each stage of the first multi-stage fluid bed reactor is essentially isothermal, with temperatures ranging from about 25° C. in the first stage to about 500° C. in the last stage.

7. The process of claim 1 wherein the fluidizing gas in the second multi-stage fluid bed reactor is air.

8. The process of claim 1 wherein each stage of the second multi-stage fluid bed reactor is essentially isothermal, with temperatures ranging from about 25° C. in the first stage to about 750° C. in the last stage.

9. The process of claim 1 wherein the cooling zone is a duct where the hot powder from the last stage of the second reactor is contacted with a cocurrent stream of cool air of controlled psychrometric properties, the residence time of the solids in the duct being sufficient to cool them to about 25° C. at the exit of the duct.

10. The process of claim 9 wherein the duct is lined with a material of a low coefficient of friction at positions where the gas-solids mixture undergoes a change in direction.

11. The process of claim 1 wherein the cooling zone is a multi-stage fluid bed reactor.

12. The process of claim 11 wherein the fluidizing gas is room temperature air.

13. The process of claim 1 wherein the solids are transported between reactors using eductors.

14. A continuous process of coating small particles with a conformal coating of protective material, optionally doped with a metal, said process comprising the steps of:
    (a) feeding solids at a controlled rate to a first multi-stage fluid bed reactor, wherein the solids are contacted with a precursor material with or without a dopant; and
    (b) passing the solids to a second multi-stage fluid bed reactor, wherein the solids are cooled; and
    (c) collecting the coated and cooled solids from the exit of the last stage of the second multi-stage reactor.

15. The process of claim 14 wherein solids are fed at a constant mass rate to bed #1 of the first reactor using a microprocessor controlled loss in weight feeder.

16. The process of claim 14 which further comprises means for cooling the distributor plate of the first reactor to a temperature below the decomposition temperature of the precursor.

17. The process of claim 14 wherein the cooling means is a set of pipes in the distributor plate through which a coolant fluid is circulated.

18. The process of claim 14 wherein temperature control means are used to maintain essentially isothermal behavior in each stage of the first multi-stage reactor.

19. The process of claim 18 wherein the temperature of the solids in the first reactor is progressively increased from room temperature to about 500° C. in a certain number of stages, and maintained at that temperature in the remaining number of stages of the first reactor.

20. The process of claim 19 wherein the fluidizing gas for the stages leading to a temperature of 500° C. is nitrogen.

21. The process of claim 19 wherein the fluidizing gas for the balance of the stages contains in addition a coating material or a precursor thereto.

22. The process of claim 21 wherein the fluidizing gas for the balance of the stages contains in addition a dopant material or a precursor thereto.

23. The process of claim 22 wherein the dopant is selected from the elements of Groups IA, IIA, IIIA, IVA, VA, VIA, VIIA, VIIIA, IB, IIB, IIIB, IVB VB, VIB and VIIB of the Periodic Table of Elements.

24. The process of claim 23 wherein the dopant is iron or a precursor therefor.

25. The process of claim 24 wherein the iron precursor is $Fe(CO)_5$.

26. The process of claim 21 wherein the precursor coating material is a precursor of alumina.

27. The process of claim 26 wherein the precursor of alumina is aluminum isopropoxide.

28. The process of claim 14 wherein hot and coated solids are transferred from the first reactor to the second reactor by a tube inclined at an angle greater than the angle of repose for the material.

29. The process of claim 14 wherein temperature control means are used to maintain essentially isothermal behavior in each stage of the second reactor.

30. The process of claim 14 wherein the solids are cooled from about 500° C. to 60° C. in the second reactor.

31. The process of claim 30 wherein the cooling is achieved by air fluidizing the stages of the second reactor.

* * * * *